United States Patent
Ohno

Patent Number: 5,773,880
Date of Patent: Jun. 30, 1998

[54] NON-CONTACT IC CARD HAVING INSULATED EXPOSED LEADS

[75] Inventor: Hisashi Ohno, Itami, Japan

[73] Assignee: Mitsubishi Denki Kabushiki Kaisha, Tokyo, Japan

[21] Appl. No.: 97,904

[22] Filed: Jul. 28, 1993

[30] Foreign Application Priority Data

Jul. 30, 1992 [JP] Japan ................................ 4-203724

[51] Int. Cl.⁶ .................................................. H01L 23/02
[52] U.S. Cl. ........................................ 257/679; 235/380
[58] Field of Search ........................... 257/48, 130, 678, 257/679; 235/449, 451, 492, 493, 488, 380

[56] References Cited

U.S. PATENT DOCUMENTS

| | | | |
|---|---|---|---|
| 3,702,464 | 11/1972 | Castrucci | 257/679 |
| 4,539,472 | 9/1985 | Poetker et al. | 235/488 |
| 4,565,922 | 1/1986 | Anderson | 257/679 |
| 4,766,480 | 8/1988 | Hamada | 257/679 |
| 5,184,209 | 2/1993 | Kodai et al. | 257/679 |
| 5,206,495 | 4/1993 | Kreft | 235/492 |

FOREIGN PATENT DOCUMENTS 0514637 11/1992 European Pat. Off. .
3227298 10/1991 Japan .

OTHER PUBLICATIONS

"Rigid Dish Smart Cart", IBM Technical Disclosure Bulletin vol. 32, No. 4A, Sep. 1989, pp. 431–432.
Sickert et al, "Schlusseltechnologie Mikroelektronik", Electronik, Dec. 1989, pp. 66–78.

Primary Examiner—Jerome Jackson
Assistant Examiner—N. Kelley
Attorney, Agent, or Firm—Leydig, Voit & Mayer, Ltd.

[57] ABSTRACT

A non-contact IC card comprising a circuit board (10), an electronic circuit (9) mounted on the circuit board (10) and having a plurality of functions, a package (14) sealing the electronic circuit (9), a plurality of testing wire conductors (8) disposed on the circuit board (10) and connected at one end to the electronic circuit (9) and exposed at the other end from the package (14) for individually testing the functions of the electronic circuit (9). Each of the other end of the testing wire conductors (8) comprises a testing pad (11) disposed on the circuit board (10). The non-contact IC card may comprise insulating means electrically insulating the other end of the testing wire conductors or the testing pads (11) from outside.

The present invention also resides in methods for manufacturing and testing the same.

4 Claims, 8 Drawing Sheets

NON-CONTACT IC CARD HAVING INSULATED EXPOSED LEADS

BACKGROUND OF THE INVENTION

This invention relates to a non-contact IC card and, more particularly, to a non-contact IC card in which data is transmitted and received by using for example, electromagnetic induction, electromagnetic coupling and microwaves without being contacted from the outside. This invention further relates to manufacturing and testing methods for it.

A known non-contact IC card sealed with a mold resin such as a liquid crystalline polymer can be tested about each of mounted elements before sealing but after it is molded it can be tested only as a whole by a reader/writer or a tester which transmits and receives data by using for example, electromagnetic waves without direct contact.

Since a known non-contact IC card is tested only as a whole after molding, each function of an electronic circuit mounted therein or each electronic element mounted therein cannot be tested individually. It is therefore impossible to find individually each malfunction or electronic element which was damaged during molded.

SUMMARY OF THE INVENTION

Accordingly, one object of the present invention is to provide a non-contact IC card free from the above-discussed problems of the known non-contact IC card.

Another object of the present invention is to provide a non-contact IC card in which each of the particular electronic elements and the functions of the electronic circuit mounted therein can be tested after encapsulation as to whether it is damaged.

Still another object of the present invention is to provide a method for manufacturing the non-contact IC card.

A further object of the present invention is to provide a testing method of the non-contact IC card.

With the above objects in view, the non-contact IC card of the present invention comprises a circuit board, an electronic circuit mounted on the circuit board and having a plurality of functions, a package sealing the electronic circuit and a plurality of testing wire conductors disposed on the circuit board and connected at one end to the electronic circuit and exposed at the other end from the package for individually testing the functions of the electronic circuit. Each of the other ends of the testing wire conductors comprises a testing pad disposed on the circuit board. A non-contact IC card may comprise insulating means electrically insulating the other ends of the testing wire conductors or the testing pads from outside.

The present invention also resides in methods for manufacturing and testing a non-contact IC card, comprising the steps of mounting an electronic circuit having a plurality of functions on a circuit board, providing a plurality of testing wire conductors on the circuit board for individually testing the functions of the electronic circuit, the testing wire conductors each having one end connected to the electronic circuit and the other end accessible for the individual function tests, forming a mold resin on the circuit board to seal the electronic circuit except for the other ends of the testing wire conductors and testing the electronic circuit with respect to the functions through the testing wire conductors. The method for manufacturing a non-contact IC card also comprises the steps of insulating the testing wire conductors from outside.

BRIEF DESCRIPTION OF THE DRAWINGS

The present invention will become more readily apparent from the following detailed description of the preferred embodiment of the present invention taken in conjunction with the accompanying drawings, in which.

DESCRIPTION OF THE PREFERRED EMBODIMENTS

Figure 1:
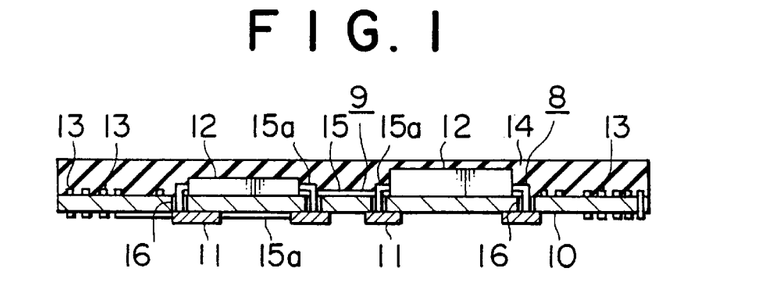
FIG. 1 is a schematic sectional view of an embodiment of a non-contact IC card of the present invention
Figure 2:
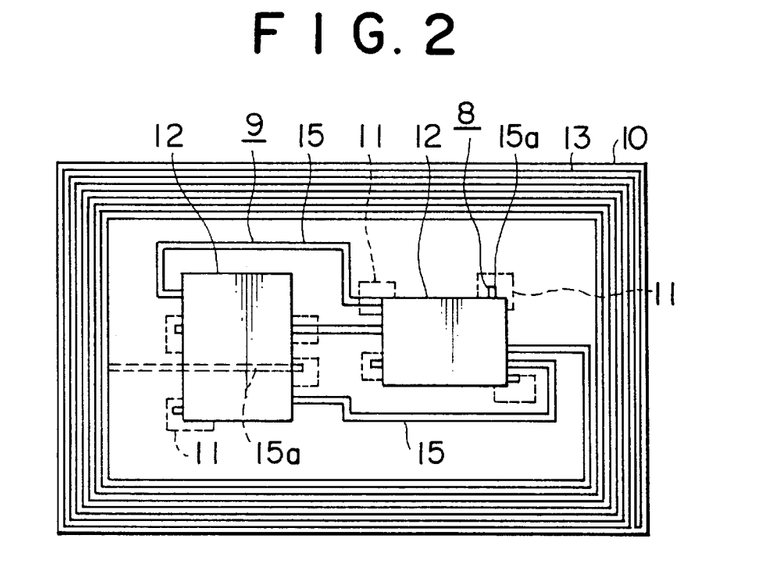
FIG. 2 is a schematic top plan view of the embodiment of the non-contact IC card illustrated in FIG. 1 but with the mold resin removed for clarity.

FIG. 1 illustrates one embodiment of the non-contact IC card of the present invention and FIG. 2 is a schematic top plan view of the embodiment of the non-contact IC card illustrated in FIG. 1 but with a resin package removed for clarity. The non-contact IC card comprises a circuit board 10 and an electronic elements 12 mounted on a surface of the circuit board 10. The electronic elements 12 are electrically connected to each other through wire conductors 15 which are disposed on the circuit board 10 and a coil antenna pattern 13 is disposed on both of the surfaces of the circuit board 10. As best seen from FIG. 2, the outer-most circuit of a coil antenna pattern 13 is along the circumferential outer edge of the circuit board 10. The coil antenna pattern 13 is connected to the electronic elements 12. The antenna pattern 13 may be disposed only on one surface of the circuit board 10. When the antenna pattern 13 is disposed on both surfaces thereof, a number of turns of the antenna pattern 13 can be increased as compared with that of on only one surface. Thus, the wire conductors 15, the electronic elements 12 and the antenna pattern 13 compose an electronic circuit 9 having a plurality of functions. The top surface (in FIG. 1) of the circuit board 10 is molded with a mold resin or a package 14 such as a liquid crystalline polymer together with the electronic circuit 9. Testing pads 11 through which the electronic element 12 or the functions in the electronic circuit 9 are tested are attached to the bottom surface (in FIG. 1) of the circuit board 10 and are exposed outside. Each of the testing pads 11 is connected to the electronic elements 12 mounted on the top surface of the circuit board 10 through a plurality of testing wires 15a which extend through a plurality of through holes 16 in the circuit board 10.

Figure 3:
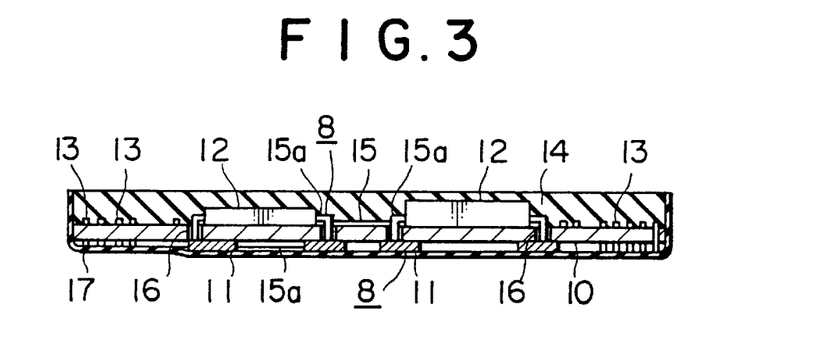
FIG. 3 is a schematic sectional view of the modified embodiment of the non-contact IC card illustrated in FIG. 1 in which the testing pads are insulated from the outside by insulating means.

Since the testing pads 11 connected to the electronic elements 12 which is completely encapsulated resin are attached to the bottom surface of the circuit board 10, the testing pads 11 are not encapsulated and are exposed outside even after the non-contact IC card is encapsulated. Each of the electronic elements 12 and each of the functions thereof can be tested easily by touching each of the testing pads 11 with a testing pin such as a tester. Thus, the testing wire conductors 8, each having one end connected to the electronic circuit 9 and the other end being the testing pad 11 and exposed outwardly from the resin 14, are composed of the testing wires 15a, the through holes 16 and the testing pads 11. Before the non-contact IC card is shipped, the testing pads 11 may be, if necessary, covered, as illustrated in FIG. 3, with insulating means 17 (See FIG. 11) which is an insulating film made for example of vinyl chloride resin to prevent access from the outside. As shown in FIG. 2, the testing pads 11 are positioned on the bottom surface correspondingly to the position of the electronic elements 12 which are mounted on the top surface, the lengths of the testing wires 15a are therefore short and do not hinder the other wire conductors 15 of the electronic circuit 9.

Figure 4:
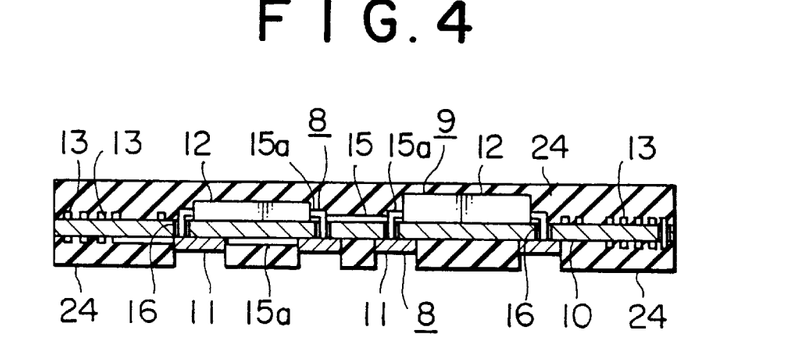
FIG. 4 is a schematic sectional view of another embodiment a non-contact IC card of the present invention.
Figure 5:
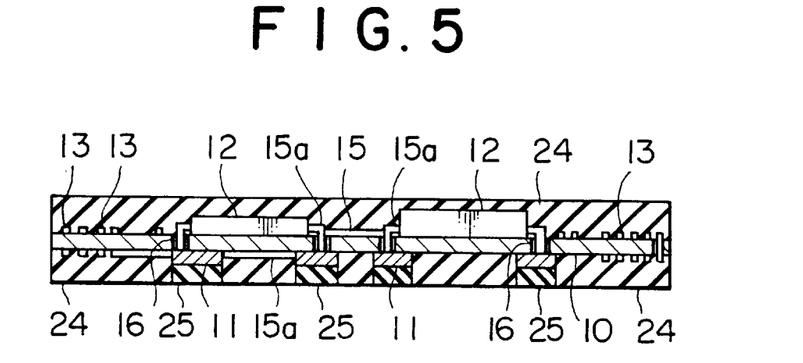
FIG. 5. is a schematic sectional view of the modified embodiment of the non-contact IC card illustrated in FIG. 4 in which the testing pads are insulated from outside by insulating mans.

FIG. 4 illustrates another embodiment of the noncontact IC card of the present invention, which has basically the same structure as that illustrated in FIG. 1 but is different in that both of the surfaces of a circuit board 10 are covered with a resin 24 such a liquid crystalline polymer except for the testing pads 11. So, the testing pads 11 are exposed. Each of electronic elements 12 and each of functions in an electronic circuit 9 can be tested through testing conductors 8 which are composed of the testing pads 11 and testing wires 15a electrically connecting the testing pads 11 and the electronic elements 12 together. After the test, the testing pads 11 may be buried in a resin 25 and insulated from the outside as illustrated in FIG. 5 to prevent access from the outside and damage during shipping and storage. For the resin 25, for example, a liquid crystalline polymer is suitable.

Figure 6:
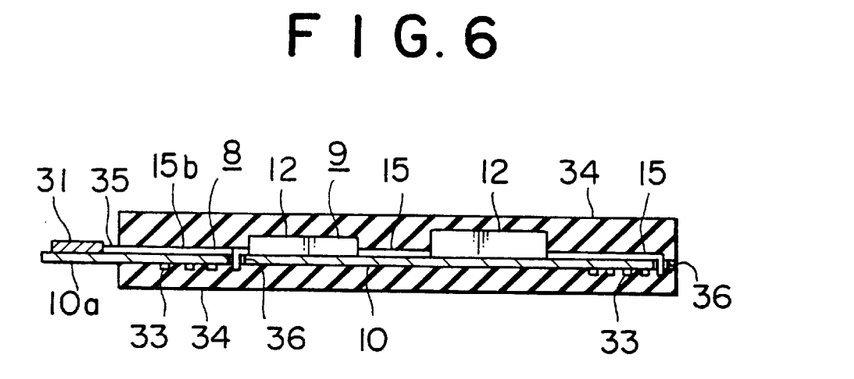
FIG. 6 is a schematic sectional view of still another embodiment of a non-contact IC card of the present invention.
Figure 7:
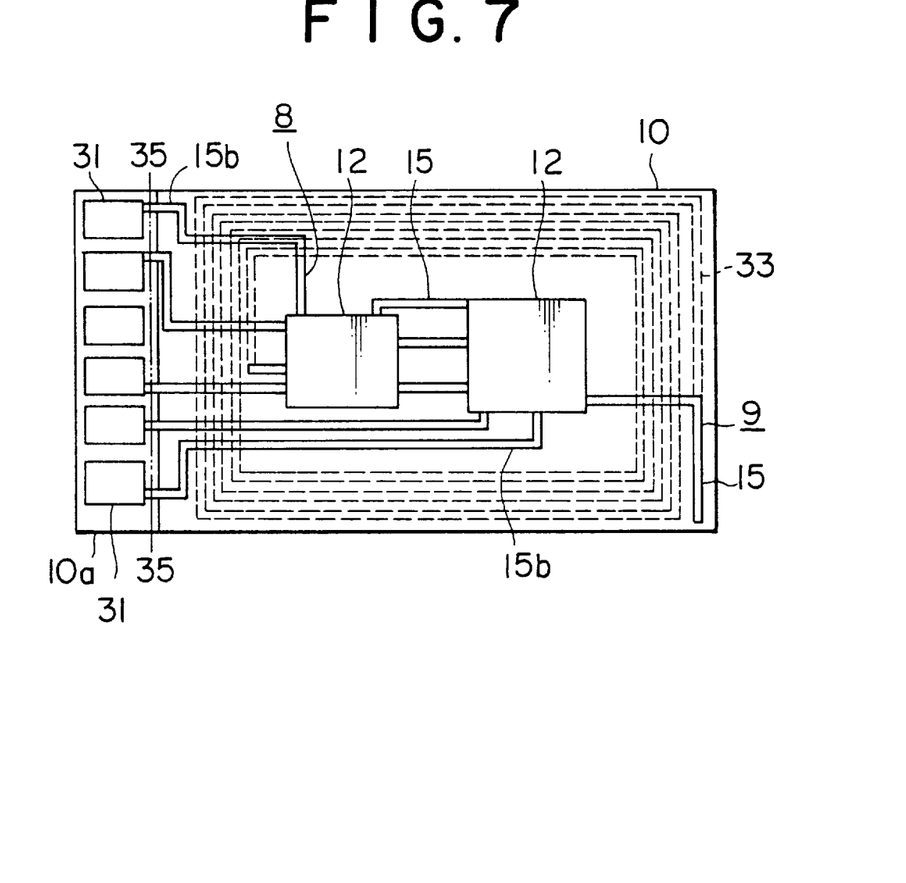
FIG. 7 is a schematic top plan view of the embodiment of the non-contact IC card of the present invention illustrated in FIG. 6 but with the mold resin removed for clarity.

FIGS. 6 and 7 illustrate still another embodiment of the non-contact IC card of the present invention, which also has basically the same structure as that illustrated in FIG. 1 but is different in that the circuit board 10 comprises an extending portion 10a which extends in a cantilevered manner and is exposed outwardly from the resin and a plurality of testing pads 31 are disposed on only the top surface of the extending portion 10a of the circuit board 10. The testing pads 31 are exposed outwardly from a mold resin 34 together with the extending portion 10a of the circuit board 10. For details, both of the surfaces of the circuit board 10 except the extending portion 10a are covered with the resin 34 such as a liquid crystalline polymer. The testing pads 31 are electrically connected to electronic elements 12 mounted on the circuit board 10 through testing wires 15b which are disposed on the circuit board 10. Since a coil antenna pattern 33 is disposed on the bottom surface of the circuit board 10 and only a connecting portion of the antenna pattern 33 for connecting to the electronic elements 12 is drawn out through a through hole 36 to the top surface of the circuit board 10, the antenna pattern 33 does not hinder the wire conductors 15 and the testing wires 15b. After the encapsulation, data is input and output through only the antenna pattern 33 by using electromagnetic induction and microwaves without any contact with the noncontact IC card. Only a necessary number of the testing pads 31 for individually testing the functions or the electronic elements 12 need to provided. Alternatively, the testing pads 31 may be prepared in a standardized fixed number to simplify the manufacturing process, and only needed testing pads 31 among them are connected to the electronic elements 12 and used for the test as illustrated in FIG. 7.

Figure 8:
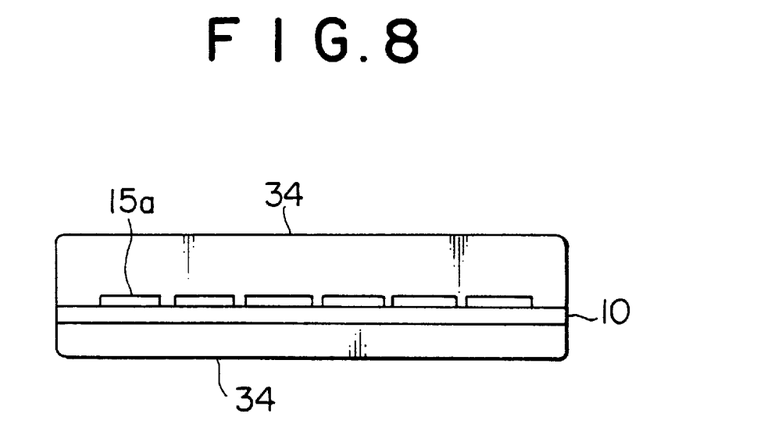
FIG. 8 is an cutting end view of the embodiment of the non-contact IC card of the present invention illustrated in FIG. 6 after cutting off of the testing pads.
Figure 9:
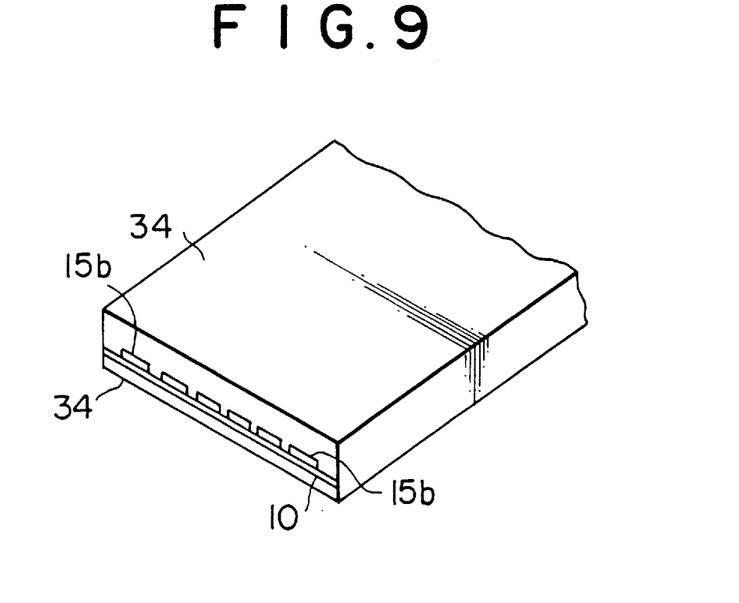
FIG. 9 is a perspective view of the embodiment of the non-contact IC card of the present invention illustrated in FIG. 8.
Figure 10:
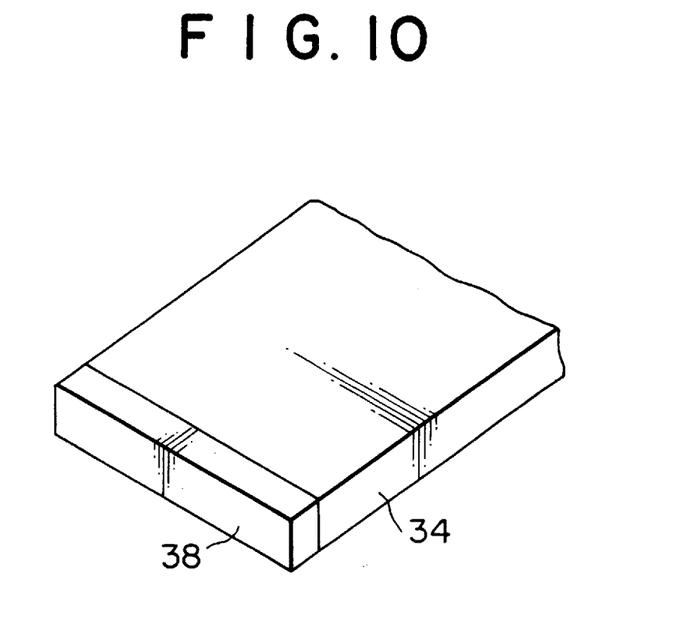
FIG. 10 is a perspective view of the modified embodiment of the non-contact IC card illustrated in FIG. 8 in which the testing wires are insulated from outside by the resin.
Figure 11:
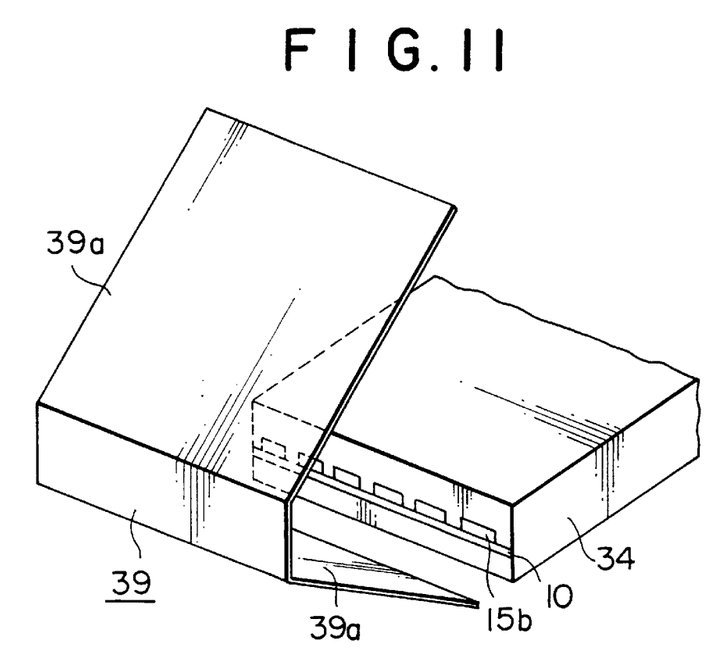
FIG. 11 is a perspective view of the modified embodiment of the non-contact IC card illustrated in FIG. 9 while the testing wires are being insulated from outside by an insulating seal.
Figure 12:
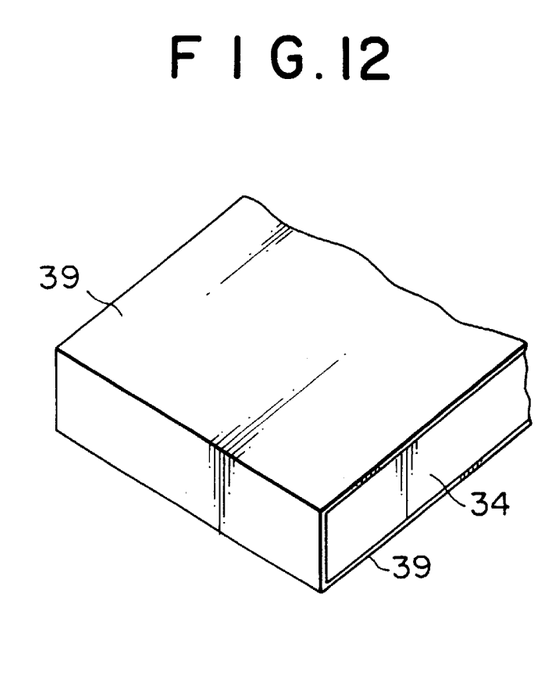
FIG. 12 is a perspective view of the embodiment of the non-contact IC card illustrated in FIG. 9 after insulated from the outside by the insulating seal.

In this embodiment also, the non-contact IC card of the present invention as described above can be tested individually with respect to the individual elements 12 through the testing pads 31. After the test, the testing pads 31 are cut off along the phantom line 35 in FIG. 7 together with the extending portion 10a of the circuit board 10, and the cutting end thereof is chamfered and faired, whereby the cutting ends of the testing wires 15b are exposed outside as illustrated in FIGS. 8 and 9. In this state, since the data and memory in the inside of the noncontact IC card may happen to be read or broken into from the cutting end of the testing wire 15b after assembly and shipment, the cutting end of the non-contact IC card may be, if necessary, covered completely with the resin 38 such as a liquid crystalline polymer, as illustrated in FIG. 10, to prevent the CPU and the memory from being electrically accessed from the outside. Alternatively, as illustrated in FIG. 11, the cutting end and both surfaces of the noncontact IC card may be covered with a suitable insulating means such as an insulating seal 39 made, for example, of vinyl chloride resin to insulate from the outside. The insulating seal 39 has two leaves 39a placed on the circuit board and the resin and the insulating seal 39 completely wraps the surfaces of the non-contact IC card with the leaves 39a. As described above, in this embodiment, the testing wire conductors 8 are composed of the testing wires 15b, the through holes 36 and the testing pads 31, and are connected at one end to the electronic circuit 9 the other ends of the testing wire conductors 8 are the testing pads 31 exposed from the resin 34. After testing, the other ends of the testing wire conductors 8 or the testing pads 31 are cut off together with the extending portion 10a of the circuit board 10 and the cutting end thereof is covered with insulating means made of an insulating material. Therefore, the testing wire conductors 8 are insulated from the outside by the insulating means. In this embodiment of the non-contact IC card, since the testing pads 31 are positioned along a straight line, the testing process is easy and can be also automatic. As the electronic circuit 9 is protected by the resin 34, this non-contact IC card is mechanically strong and durable.

Figure 13:
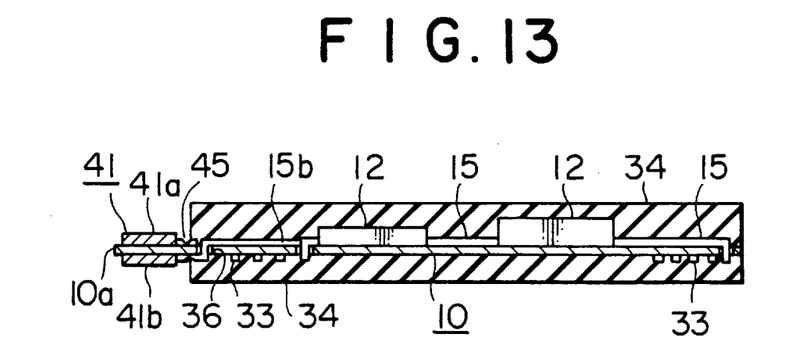
FIG. 13 is a schematic sectional view of still another embodiment of a non-contact IC card of the present invention.
Figure 14:
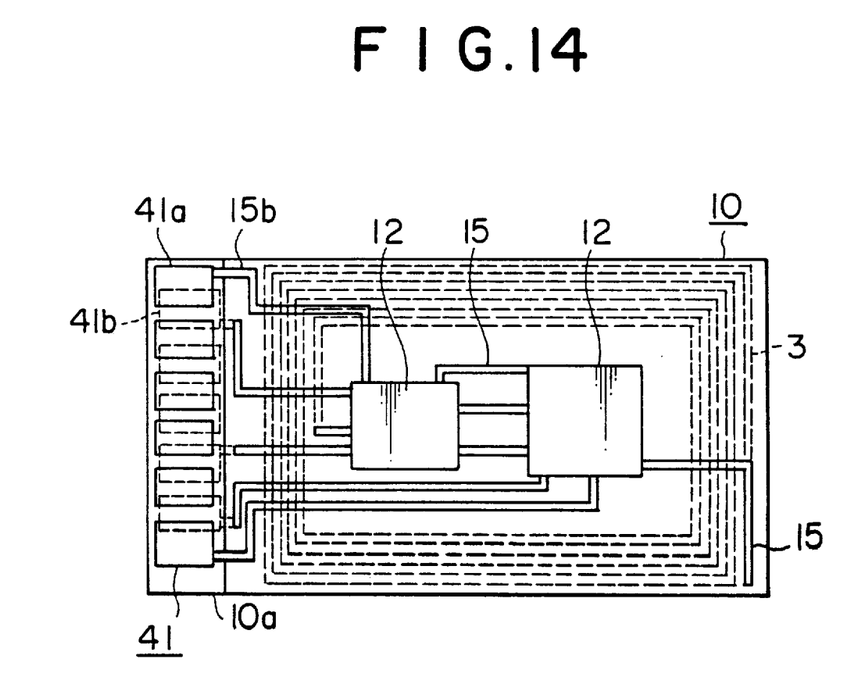
FIG. 14 is a schematic top plan view of the embodiment of the non-contact IC card of the present invention illustrated in FIG. 13 but with the mold resin removed for clarity.
Figure 15:
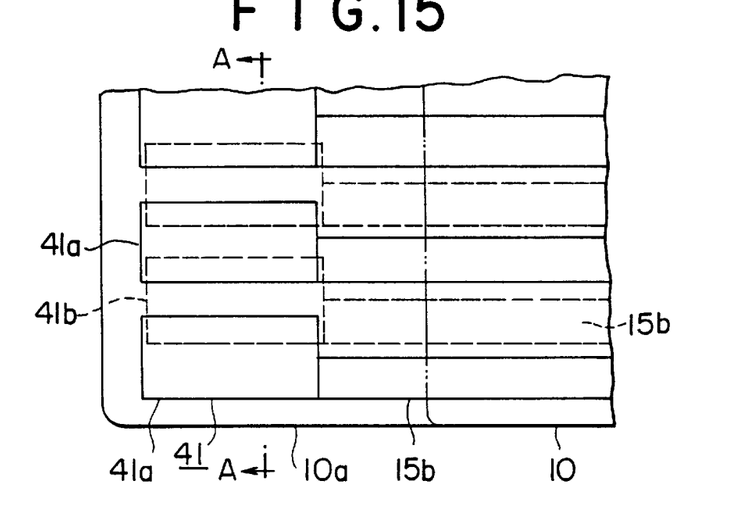
FIG. 15 is a fragmented schematic enlarged top plan view of the embodiment of the non-contact IC card illustrated in FIG. 14 showing connecting portions between the testing pads and the testing wires.
Figure 17:
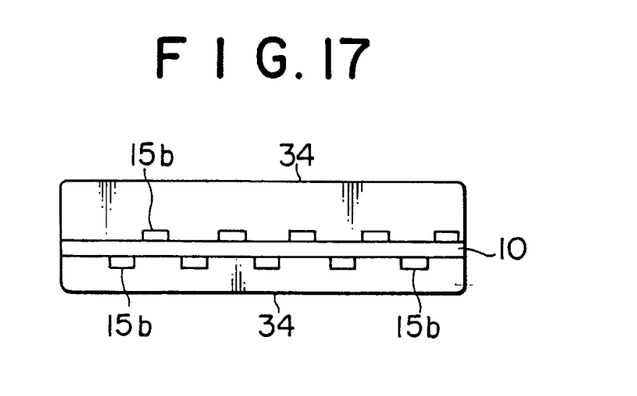
FIG. 17 is an cutting end view of the embodiment of the non-contact IC card illustrated in FIG. 13 after cutting off of the testing pads.

FIGS. 13 and 14 illustrate still another embodiment of the non-contact IC card of the present invention, which is suitable for use, for example, in case a relatively large number of electronic elements 12 are mounted on the circuit board 10 and a large number of testing pads 41 are needed, and which has basically the same structure as that illustrated in FIGS. 6 and 7 but is different in that the testing pads 41 are disposed on both surfaces of an extending portion 10a of the circuit board 10. As illustrated in FIG. 13, the testing pads 41a are disposed on the top surface of the circuit board 10 and the testing pads 41b are disposed on the bottom surface thereof, and the testing wires 15b which are connected to the testing pads 41 are pulled out to the top surface of the circuit board 10 through a plurality of through holes 36 and are connected to electronic elements 12 which are mounted on the top surface of the circuit board 10. The other structures are completely the same as that of FIGS. 6 and 7. As illustrated in FIG. 15, all the testing pads 41 are connected to the testing wires 15b to be used during testing. In another way, as illustrated in FIG. 14, only the needed testing pads 41 among a fixed number need to be connected to be used during test. Further, in this embodiment also, similarly to the embodiment illustrated in FIGS. 6 and 7, the testing pads 41 are cut off together with the extending portion 10a of the circuit board 10 at the cutting portion 45 in FIG. 13 after each of the electronic elements 12 mounted on the circuit board 10 has been tested individually through the testing pads 41. FIG. 17 is an end view of the cut end thereof. As seen from FIG. 17, since the testing wires 15b are exposed outwardly, the cutting end may be insulated to be prevent electrical access from the outside by the same method as in the above embodiment.

Figure 16:
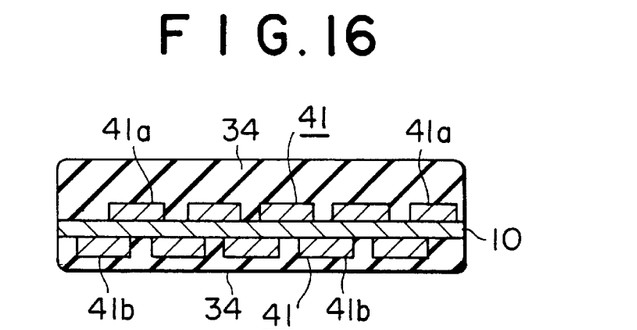
FIG. 16 is a sectional view of the embodiment of the non-contact IC card taken along line A—A in FIG. 15.

As illustrated in FIG. 15 and FIG. 16, the testing pads 41a mounted on the top surface of the circuit board 10 and the testing pads 41b mounted on the bottom surface thereof may be overlapped in a direction parallel to the circuit board 10 (horizontally in the figures), however, the testing wires 15b which are mounted respectively on the top surface and the bottom surface should not be overlapped in the direction parallel to the circuit board 10. If there are overlapped portions, when the testing pads 41 are cut off at a cutting portion 45 illustrated in FIG. 13 by cutting means having an electrically conductive metallic cutting edge (not shown), electrical short-circuiting may occur between the testing testing wires 15b on the top surface and the testing wires 15b on the bottom surface through the metallic edge of the cutting means. If a cutting burr of the testing wire 15b on one surface extend and connects to the testing wire 15b on the other surface thereof, the electrical short-circuiting may occur.

Figure 18:
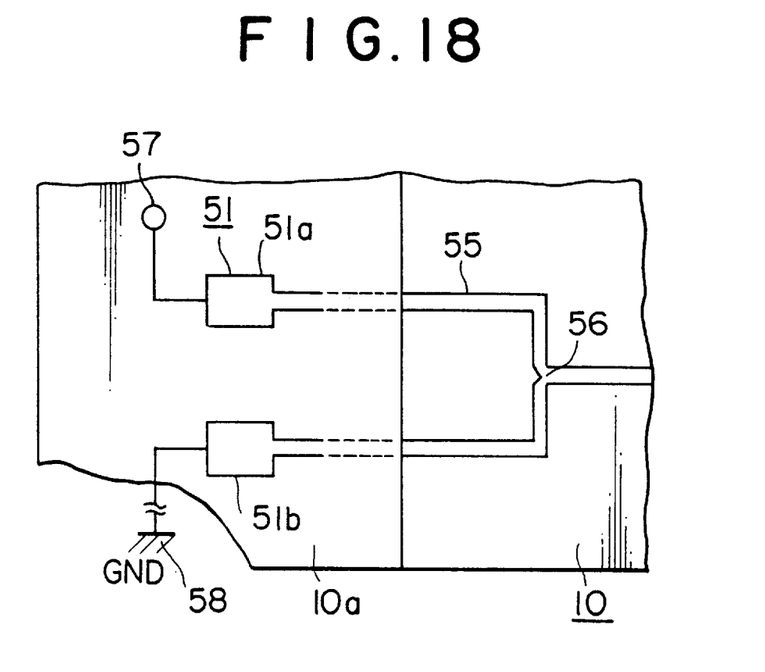
FIG. 18 is an enlarged schematic fragmented top plan view of still another embodiment of a non-contact IC card of the present invention but with the mold resin removed for clarity.
Figure 19:
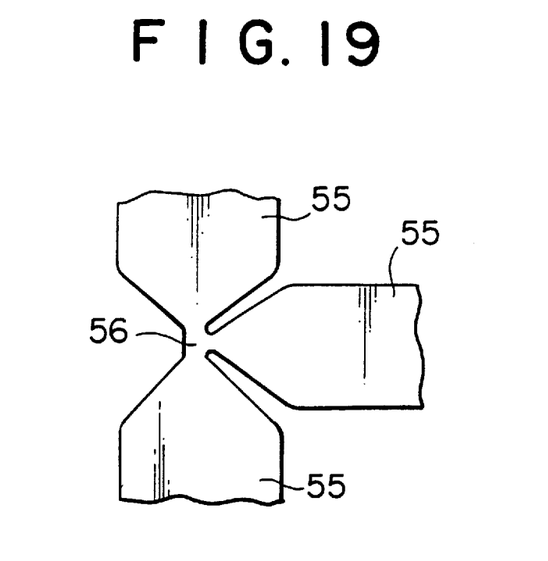
FIG. 19 is an enlarged top plan view of the fuse in the embodiment of the non-contact IC card illustrated in FIG. 18.

FIGS. 18 and 19 illustrate still another embodiment of the non-contact IC card of the present invention, which has basically the same structure as that illustrated in FIG. 6 or that illustrated in FIG. 13. A difference structure is that one portion of the testing wire conductor is a fuse and a high voltage applied from outside opens the fuse after testing.

Similarly to the above embodiments illustrated in FIGS. 6 and 13, the electronic elements 12 are mounted on a circuit board 10, and the circuit board 10 except the extending portion 10a, is encapsulated with a resin such as a liquid crystalline polymer. The extending portion 10a is exposed from the resin and extends outwardly in a cantilevered manner. On the bottom surface of the circuit board 10, the antenna pattern 33 is disposed. As illustrated in FIG. 18, the testing pads 51 are disposed on the extending portion 10a and are connected to the electronic elements 12 through testing wires 55 disposed on the circuit board 10. Each of the testing wires 55 forks into two branches near the testing pads 51 in the mold resin, and the fuse 56, which has a small cross-sectional area is formed at the fork portion in the testing wire 55. The two branches of the testing wire 55 are connected to two of the testing pads 51a and 51b at the outside of the mold resin. FIG. 19 is an enlarged view of the fuse 56. After the electronic elements 12 have been individually tested through the testing pad 51a or 51b, a terminal 57 and a ground terminal 58 are respectively connected to the testing pads 51a and 51b. Then, a high voltage is applied to the terminal 57 until the fuse 56 is opened and the testing wire 55 is insulated from outside. Then, the testing pads 51 may be cut off together with the extending part 10a of the circuit board 10. The fuse 56 which was opened by the high voltage provides a gap which insulates one end of the testing wire conductor 8 from the electronic circuit 9 and which functions as an insulating means for insulating the testing wire conductor 8. In this embodiment of the non-contact IC card of the present invention, by using a high voltage, the testing wire conductor after testing can be insulated easily from outside and access from outside can be prevented.

As has been described, the non-contact IC card of the present invention comprises a plurality of testing wire conductors connected at one end thereof to an electronic circuit on a circuit board having a plurality of functions and exposed at the other end thereof from a package for individually testing any desired functions of the electronic circuit. Therefore, the functions and/or electronic components of the electronic circuit molded within the package can be individually tested, whereby the position of the faults or damage caused by molding can be determined and precise quality control can be achieved.

What is claimed is:

1. A non-contact IC card comprising:

a circuit board having opposed first and second surfaces;

an electronic circuit mounted on the first surface of said circuit board and having a plurality of functions;

a resin package disposed on the first and second surfaces of said circuit board, covering said electronic circuit, and having an end surface transverse to and exposing an edge of said circuit board;

a plurality of testing wire conductors disposed on the first surface of said circuit board, each testing wire conductor being connected at a first end to said electronic circuit and being flush with and exposed at the end surface of said resin package; and insulating means for electrically insulating said second ends of said testing wire conductors.

2. The non-contact IC card as claimed in claim 1, wherein said insulating means comprises an insulating sheet disposed on the end surface of said resin package covering and insulating said second ends of said testing wire conductors.

3. The non-contact IC card as claimed in claim 2 wherein said insulating sheet has a fold disposed along at least one edge of said resin package.

4. The non-contact IC card as claimed in claim 1 wherein said insulating means comprises a fuse disposed in said testing wire conductor within said resin package for opening to disconnect said testing wire conductor.

* * * * *